United States Patent [19]

Schimpe

[11] Patent Number: 5,184,247
[45] Date of Patent: Feb. 2, 1993

[54] OPTICALLY STABILIZED FEEDBACK AMPLIFIER

[75] Inventor: Robert Schimpe, Ottobrunn/Riemerling, Fed. Rep. of Germany

[73] Assignee: Siemens Aktiengesellschaft, Munich, Fed. Rep. of Germany

[21] Appl. No.: 554,270

[22] Filed: Jul. 17, 1990

[30] Foreign Application Priority Data

Jul. 17, 1989 [DE] Fed. Rep. of Germany ....... 3923628

[51] Int. Cl.$^5$ .................. H01S 3/18; H01S 3/133; H01S 3/098
[52] U.S. Cl. .................. 359/344; 359/339; 359/346; 372/20; 372/45; 372/50
[58] Field of Search .............. 372/20, 45, 50; 357/17; 359/339, 344, 346

[56] References Cited

U.S. PATENT DOCUMENTS

| | | | |
|---|---|---|---|
| 3,849,738 | 11/1974 | Hakki | 331/94.5 |
| 3,868,589 | 2/1975 | Wang | 372/50 |
| 4,111,521 | 9/1978 | Streifer et al. | 359/344 |
| 4,143,940 | 3/1979 | Khoe | 350/96.15 |
| 4,680,769 | 7/1987 | Miller | 372/50 |
| 4,719,636 | 1/1988 | Yamaguchi | 372/50 |
| 4,748,630 | 5/1988 | Nagashima | 372/8 |
| 4,794,346 | 12/1988 | Miller | 330/4.3 |
| 4,869,568 | 9/1989 | Schimpe | 350/96.12 |

FOREIGN PATENT DOCUMENTS

| | | |
|---|---|---|
| 0223136 | 5/1987 | European Pat. Off. |
| 0226728 | 7/1987 | European Pat. Off. |
| 0285393 | 10/1988 | European Pat. Off. |
| 0174729 | 12/1988 | European Pat. Off. |
| 409177 | 1/1991 | European Pat. Off. |
| 3543509 | 6/1987 | Fed. Rep. of Germany |
| 3704622 | 8/1988 | Fed. Rep. of Germany |
| 3809440 | 9/1988 | Fed. Rep. of Germany |
| 62-144382 | 6/1987 | Japan |

OTHER PUBLICATIONS

Numai et al; Appl. Phys. Lett., vol. 53, #13, pp. 1168-1169 Sep. 26, 1988; abst only supplied.
Bor et al.; Appl. Phys. B (German), vol. B31, #4, pp. 209-213, Aug. 1983; abst. only supplied.
"Tunable Optical-Wavelength Conversion Using an Optically Triggerable Multielectrode Distributed Feedback Laser Diode", Kawaguchi et al, *IEEE Journal of Quantum Electronics*, vol. 24, No. 11, Nov. 1988, pp. 2153-2159.
"GaAs Laser Amplifiers", Kosonocky et al, *IEEE Journal of Quantum Electronics*, vol. QE-4, No. 4, Apr. 1968, pp. 125-131.
"Review of rate earth doped fibre lasers and amplifiers", Urquhart, *IEE Proceedings*, vol. 135, pt. J, No. 6, Dec. 1988, pp. 385-407.
"A Broad Range of Fiber Technologies Seen for the Future", Hecht, *Lasers & Applications*, Jan. 1987, pp. 51-56.
"An optical-wavelength conversion laser with tunable range of 30 Å" Yamakoshi et al, *OFC '88 Conference on Optical Fiber Communication; OFC '88 Conference on Optical Fiber Sensors*, pp. PD10-1-PD10-4.
"Optical Exclusive OR logic operation of tunable wavelength conversion laser diode", Nobuhara et al, *47th Annual Device Research Conference*, Jun. 1989, p. IVA-7.
Mukai et al, "Coupled Parallel Waveguide Semiconductor Laser", *Applied Physics Letters*, vol. 44, No. 5, Mar. 1, 1984, pp. 478-480.
Amann et al, "Tuning Range and Threshold Current of the Tunable Twin-Guide (TTG) Laser", *IEEE Photonics Technology Letters*, vol. 1, No. 9, Sep. 1989, pp. 253-254.
Bachus et al, "Optical Coherent Multicarrier Switching Experiment", *IOOC '89*, Japan, 1989, Paper 20D2-2.

*Primary Examiner*—Nelson Moskowitz
*Attorney, Agent, or Firm*—Hill, Steadman & Simpson

[57] ABSTRACT

An arrangement for operation as an optical feedback amplifier which is composed of a DFB laser whose grating selects a wavelength that differs by so much from the wavelength at which the amplification medium has a maximum gain that a constant amplification effect at this beamed-in wavelength is achieved by a progressive quenching of the emission of this wavelength selected by the grating given external optical irradiation via a coupled waveguide of light having a wavelength in the proximity of the wavelength of the gain maximum of the amplification medium.

20 Claims, 4 Drawing Sheets

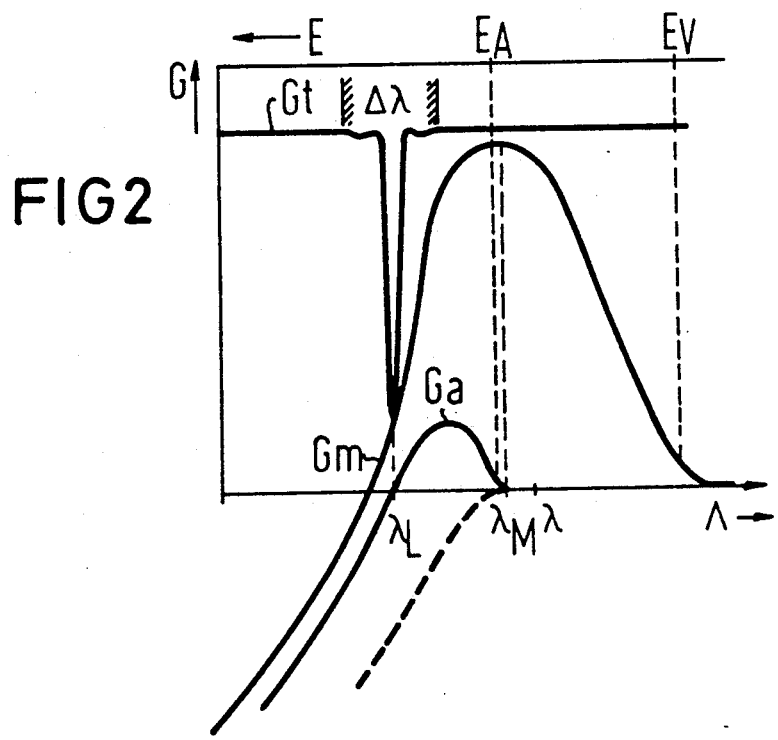
FIG 2
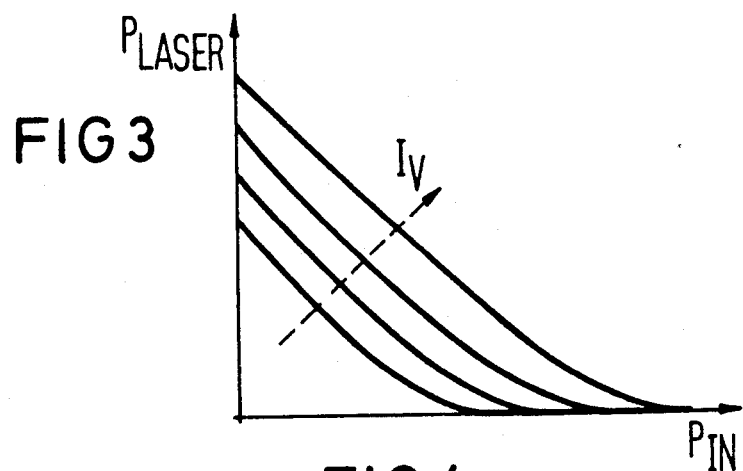
FIG 3
FIG 4
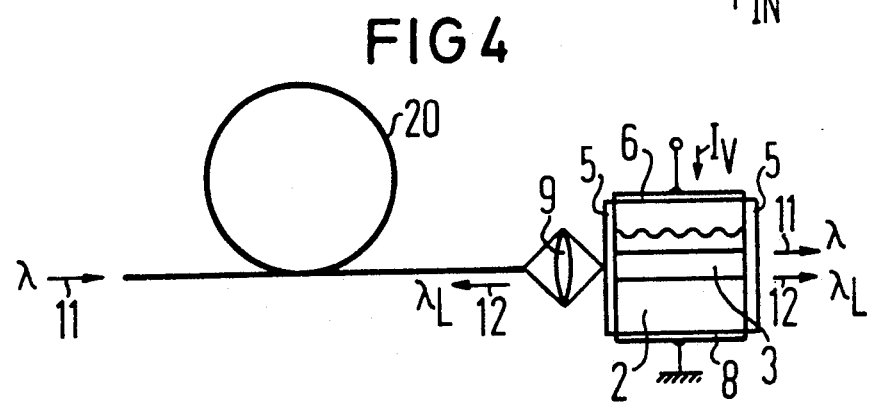

OPTICALLY STABILIZED FEEDBACK AMPLIFIER

BACKGROUND OF THE INVENTION

The present invention is directed to an arrangement for a distributive feedback (DFB) laser as an optically stabilized feedback amplifier.

An arrangement wherein a (positive) feedback is achieved with optical radiation into a DFB laser is disclosed in an article by H. Kawaguchi et al entitled "Tunable Optical-Wavelength Conversion Using an Optically Triggerable Multielectrode Distributed Feedback Laser Diode", IEEE Journal of Quantum Electronics, Vol 24, No. 11, November 1988, pp. 2153-2159. This article describes a DFB laser having a saturatable absorber, whose effect is that the DFB laser operating below the laser threshold can be activated by a beamed-in light. This apparatus is also provided for wavelength tuning.

U.S. Pat. No. 4,736,164, whose disclosure is incorporated herein by reference thereto and which claims priority from the same two applications in the United Kingdom as published European Specification 0 174 729, discloses a method for amplifying an optical signal. The method comprises infeed of an optical signal to be amplified into the active layer of a semiconductor laser structure, through which a driver current flows, whereby an amplified signal is emitted by the active layer, and whereby, in this method, the wavelength $\lambda_M$ of the amplification maximum given this driver current for the lower power limit of the optical input power a longer $\lambda_{UPPER}$ of the two wavelengths given zero amplification with the drive current for the lower power limit of the optical input power. The wavelength $\lambda$ of the optical signal to be amplified is limited by the following equation:

$$\lambda_{UPPER} > \lambda > \lambda_M$$

An arrangement wherein a constant optical amplification is achieved by an optical radiation into a semiconductor laser is described in a publication by W. F. Kosonocky et al entitled "GaAs Laser Amplifiers", IEEE Journal of Quantum Electronics, Vol. QE-4, No. 4, April 1968, pp. 125-131. This publication describes a semiconductor laser having a Fabry-Perot resonator wherein the light to be amplified is beamed-in perpendicular to the propagation direction of the laser light.

SUMMARY OF THE INVENTION

An object of the present invention is to specify an arrangement having a semiconductor laser with which, among other things, a constant optical amplification can be achieved in a simple manner.

The object of the present invention is achieved by an improvement in an arrangement having a semiconductor laser that comprises means forming a wavelength filter, at least one optical amplification medium and a resonator, the means forming a wavelength filter selects a wavelength $\lambda_L$ providing for the laser operation and wherein the amplification medium comprises a marked wavelength ($\lambda_M$), whereat a gain in the amplification medium is maximum, given laser operations. The improvements are that the means forming a wavelength filter is fashioned so that the difference between the threshold gain of the resonator and the gain of the amplification medium in the laser operation is lower at the selected wavelength ($\lambda_L$) than at the marked wavelength ($\lambda_M$) and that the arrangement includes an apparatus for the optical radiation of the amplifying medium with at least one wavelength.

Preferably, the means forming a wavelength filter is a grating. Preferably the semiconductor laser comprises a waveguide as an integral component part and the apparatus for the optical irradiation is an external waveguide coupled to this waveguide of the semiconductor laser. The external waveguide can be a fiber guide which is doped with erbium. Preferably, the end faces of the existing resonator of the semiconductor laser are provided with anti-reflection coatings and the arrangement includes an apparatus for the outfeed of the radiation from the semiconductor laser. The semiconductor may contain an optically saturatable absorber. Preferably, the selected wavelength $\lambda_L$ differs from the marked wavelength $\lambda_M$ by at least so much that the wavelength filter is transmissive for the marked wavelength. The beamed-in wavelength is outside of the wavelength arranged around the selected wavelength $\lambda_L$, at which the wavelength filter is selectively reflective.

The arrangement of the present invention can be used as an optical feedback amplifier, wherein the strength of the applied operating current ($I_V$) is set such that the semiconductor laser emits at the selected wavelength, and whereby the beamed-in light has a wavelength at which the wavelength filter is transmissive. The optical feedback amplifier can be characterized in that the wavelength of the beamed-in light approximately corresponds to the marked wavelength $\lambda_M$. The arrangement can be used as a tunable optical wavelength converter, wherein the selected wavelength $\lambda_L$ is employed as an output signal. The arrangement can be used in an optical logic gate, wherein the beamed-in optical intensity is increased so that the laser emission of the selected wavelength $\lambda_L$ is entirely quenched. In addition, the arrangement can be used as an optical pulse regenerator or an optical controllable pulse generator. The arrangement can also be used as a phase modulator by varying the refractive index of the amplification medium by means of a variation of electrical pumped rate in variation of the intensity of the optical irradiation. Finally, when the fiber guide is used with a fiber amplifier, the radiation of the selected wavelength $\lambda_L$ emitted by the semiconductor laser is employed for the optical pumping o this fiber amplifier.

Other advantages and features of the invention will be readily apparent from the following description of the preferred embodiments, the drawings and claims.

BRIEF DESCRIPTION OF THE DRAWINGS

FIG. 2 is a graph showing the threshold gain Gt of the resonator, the gain Gm of the amplifying medium, and the gain Ga of the absorbent medium in laser operation with the plots showing gain versus wavelength;

FIG. 3 shows a radiant power of the laser entered over the power of the beamed-in light with the operating current as a parameter;

FIG. 4 is a schematic illustration of the arrangement of the invention as it functions as a fiber amplifier;

DESCRIPTION OF THE PREFERRED EMBODIMENTS

Figure 1:
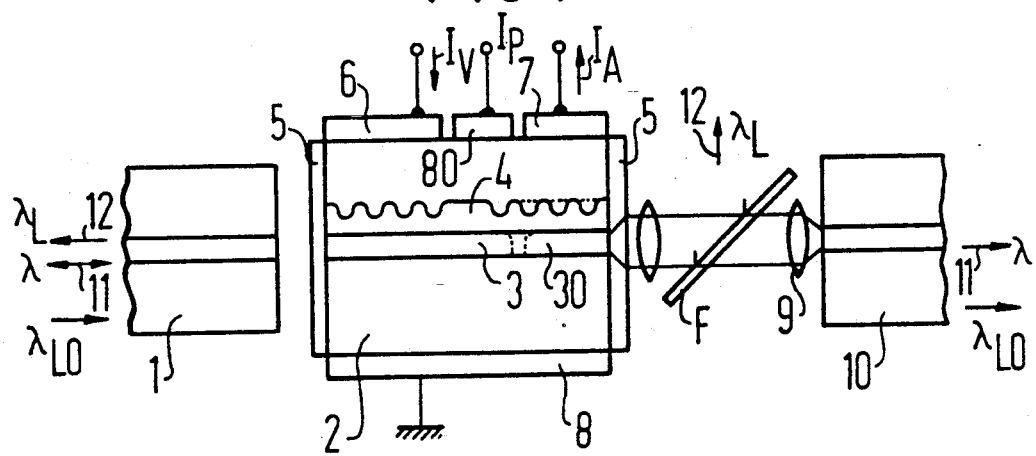
FIG. 1 is a schematic longitudinal cross sectional view through an arrangement of the present invention.

The principles of the present invention are particularly useful when incorporated in the arrangement illustrated in FIG. 1. The arrangement includes a semiconductor laser 2 having at least one (facultatively tunable) narrow-band wavelength filter and having at least one optical amplification medium, so that it is possible to generate laser emissions at a selected wavelength $\lambda_L$. This selected wavelength $\lambda_L$ is preferably different from a wavelength $\lambda_M$ of maximum gain of the amplification medium given laser operations, and which is referred to as a marked wavelength $\lambda_M$.

For example, the wavelength filter can be a waveguide Bragg reflector potentially having phase-shift gratings 4 or having electronically tunable shift zones. The bandwidth $\Delta\lambda$ of, for example a Bragg reflector amounts to:

$$\Delta\lambda = \lambda_L^2 K/(\pi n_g R^{\frac{1}{2}}),$$

whereby R is the allowed residual intensity reflection of the filter outside of the bandwidth of the filter, $\lambda_L$ is a selected wavelength that has already been defined, K is a coupling factor of the Bragg reflector grating for 180° reflection of the grating and $n_g$ is the effective group refractive index of the waveguide.

Since the residual intensity reflection R can become, at most, equal to 1, $\Delta\lambda$ is at least equal to the stop band $\Delta\lambda_S = \lambda_L^2 K/(\pi n_g)$ of the waveguide Bragg reflector. In order to be able to sweep a great range with the wavelength, the coupling factor should be optimally low. For example, a stop bandwidth of $\Delta\lambda_S = 0.19$ nm occurs for a coupling factor $K = 10$ cm$^{-1}$, a wavelength $\lambda_L = 1550$ nm and the effective group refractive index $n_g = 4$. When a residual intensity reflection of $R < 1\%$ is required, then the beamed-in light should avoid an approximate 2 nm width wavelength $\Delta\lambda$ around the laser wavelength $\lambda_L$. What would be characteristic of the optical irradiation within this wavelength range is that the wavelength $\lambda$ must be selected exactly to fractions of a nanometer, due to the resonance effect in the wavelength filter. Given an appropriate selection of the wavelength $\lambda$, reflection instead of transmission of the beamed-in light can even occur. The wavelength $\lambda$ is freely selectable outside of this wavelength range $\Delta\lambda$; however, wavelengths $\lambda$ close to the marked wavelengths $\lambda_M$ are especially advantageous.

Due to the anti-reflection coatings 5 on the end of the semiconductor laser 2, radiation 11 having a wavelength $\lambda$ outside of the recited bandwidth $\Delta\lambda$ of the wavelength filter can pass through the resonator largely unimpeded. A part of the beamed-in light 11 can also be reflected back out of the resonator amplifier. The optical amplification medium is composed of, for example, an AlGaAs or InGaAsP double heterostructure having a pn-junction. The optical waveguide parallel to the semiconductor layers, for example, can occur with a MCRW (metal clad ridge waveguide) structure or with a BH (buried hetero) structure. The amplification medium can also contain quantum wells. In order to generate the optical amplification, the density of the electrical carrier and the amplification medium is increased, for example by injection of a current $I_V$ in the forward direction of the pn-junction or by optically pumping.

The arrangement also includes a device for directing optical radiation into the amplifying medium that, for example, can be fashioned as a waveguide layer 3 in the semiconductor laser 2 and for outcoupling of the optical radiation. The wavelength $\lambda$ of the beamed-in radiation 11, preferably, lies close to the marked wavelength $\lambda_M$ and, preferably, lies outside of the above-mentioned bandwidth $\Delta\lambda$ of the wavelength filter. The apparatus for incoupling and outcoupling of the radiation 11, for example, can be composed of fiber guides or conductors 1 and 10 and, potentially, of a filter F arranged between lenses 9 for coupling the radiation out of the semiconductor laser 2. This filter F reflects the laser emission 12 perpendicularly out of the beam path and allows the in-coupled radiation 11 to pass.

In an alternate embodiment, an optical saturatable absorber, preferably pumped by radiation at the selected wavelength $\lambda_L$ can be integrated in the semiconductor laser 2. The structure in FIG. 1 would then be established by the boundaries illustrated in broken lines, wherein an absorber 30 is formed by a separate layer or portion of the layer of material in the plane of the waveguide layer 3. As shown, the grating 4 can also be fashioned only in the region above the amplifying medium. The appertaining electrodes, for example the first electrode 6 for the operating current $I_V$, a second electrode 7 for the absorber current $I_A$ and a common third electrode 8 are illustrated in FIG. 1. A fourth electrode 80 is also facultatively provided for a phase-shift current $I_P$. The medium having the saturatable absorption is composed, for example, of AlGaAs or InGaAsP double hetero-structure having a pn-junction. Absorbent medium can also contain quantum wells.

The pn-junction can be biased in a backward direction in order to increase the absorption. Given light irradiation, a current $I_A$ can then flow. Dependent on the applied goal, the electronic energy band $E_A$ of the absorption medium can be different from or the same as the electronic band gap $E_V$ of the amplification medium. The absorbent medium is preferably situated inside the resonator.

A diagram is illustrated in FIG. 2 and has the threshold gain Gt of the resonator, the gain Gm of the amplification medium in the laser operation and (the essentially negative) gain Ga of the absorbent medium all plotted relative to the wavelength. The electronic band gaps $E_V$ and $E_A$ of the amplifying and, respectively, absorbent medium are likewise shown. The gain Gm of the amplification medium is maximum at the wavelength $\lambda_M$. The selective wavelength $\lambda_L$ is defined by the integrated wavelength filter. The fashioning or, respectively, dimensioning of the wavelength filter, for example of a grating 4, must be selected so that the difference between the threshold gain Gt of the resonator and the gain Gm of the amplifying medium for the wavelength $\lambda_L$ is lower than for the wavelength $\lambda_M$. What is achieved is that a curve of the gain Gm of the amplification medium assumes the position shown in FIG. 2 when the operating current $I_V$ is increased. The semiconductor laser 2 then emits at the wavelength $\lambda_L$. Since the maximum of the curve of the gain Gm of the amplification medium is situated under the threshold gain Gt of the resonator at the location $\lambda_M$, the semiconductor laser will not emit with this marked wavelength $\lambda_M$, at which it would resonate without the wavelength filter. An adequate low minimum of the curve of the threshold gain Gt of the resonator at the point $\lambda_L$ is achieved on the basis of the corresponding fashioning of the wavelength filter. For this purpose, the grating 4 must have a low coupling degree and a great length. The Bragg grating having $K=10$ cm$^{-1}$ coupling efficiency should therefore have a length of at least approximately 1000 μm.

FIG. 3 shows the dependency of the intensity of the laser emission on the intensity of the beamed-in radiation, dependent on the operating current $I_V$. The curve is shifted in the direction of the arrow when the operating current $I_V$ that manages the electrical pumping becomes higher. A high optical radiant intensity $P_{IN}$ in the active medium occurs due to the radiation at the wavelength $\lambda$ of high optical gain of the amplification medium, i.e., $\lambda$ is in the proximity of the marked wavelength $\lambda_M$. The number of available electron carriers decreases with increasing optical radiant intensity $P_{IN}$ at the wavelength $\lambda$, so that the laser power $P_{LASER}$ correspondingly decreases at the wavelength $\lambda_L$. FIG. 3 shows the optical control of the laser emission of an InGaAsP DFB laser at the wavelength $\lambda_L = 1280$ nm. The laser emission of the wavelength $\lambda_L$ can be shut off by beaming in a fraction of the intensity of the laser power at a wavelength $\lambda = 1300$ nm of the maximum of the optical gain in the laser operation. The optical gain is thereby maintained in a relatively broad wavelength range around the wavelength $\lambda_L$ of the laser oscillation when adequate laser power is present at the wavelength $\lambda_L$. This optical feedback, due to the laser power at the wavelength $\lambda_L$, can achieve control times down to picoseconds, given semiconductor laser amplifiers. The arrangement works as an optical feedback amplifier or as a (facultatively tunable) wavelength converter dependent upon whether the light of the wavelength $\lambda$ or $\lambda_L$ is employed as an output signal. When the wavelength $\lambda_L$ is shorter than the wavelength $\lambda$ of the beamed-in light, the optical gain of the feedback amplifier is especially stable or, respectively, the wavelength conversion is particularly efficient.

Due to additional irradiation of the light of a local oscillator at the wavelength $L_{LO}$ in the proximity of the wavelength L of the irradiated (signal) light, the efficiency of the wavelength conversion can be increased. The increase in the efficiency is based o signal intensification by coherent superposition of optical waves. When the signal light is composed of a plurality of optical channels having the wavelengths $L_1, \ldots, L_J \ldots, L_N$, the coherent signal intensification can be used for the selection of, for example, the $J^{th}$ channel having the wavelength $L_J$. The information of the $J^{th}$ channel is available at the wavelength $L_J''$. By driving a further wavelength converter, the information can be converted onto the desired wavelength, particularly into the original wavelength range $L_1, \ldots, L_N$ as well.

The laser emission can be entirely quenched due to an adequately strong input signal (function as an optical invertor). The optical control of the laser power can also occur on the basis of a plurality of input signals and a different wavelength under certain circumstances (function as an optical NOR gate). The dependency of the laser power on the input signal becomes non-linear when a medium having optically saturatable absorption is located in the beam path or, respectively, in the resonator. the non-linearity is the absorbent medium $E_A$ is equal to or greater than the electronic energy band gap $E_V$ of the amplification medium. The absorption can then be preferably influenced by light having the wavelength $\lambda_L$.

The laser power is lowered by irradiation: however, the absorption in the resonator is also lowered as a consequence. Due to this optical, non-linear behavior, the laser oscillator ceases above a defined threshold of the irradiated power so that an optical pulse regeneration with a signal inversion is achieved.

When an optically saturatable absorber preferably has an electronic band gap $E_A$ equal to or less than the electronic energy band gap $E_V$ of the amplification medium is additionally situated inside the resonator, then the optical pulse sequence at the wavelength $\lambda_L$ can be generated by as corresponding selection of the arrangement and operating mode. The intensity and repetition rate of this pulse sequence can be influenced by irradiation at the wavelength $\lambda$.

When the intensity of the laser emission at the wavelength $\lambda_L$ is varied by the optical irradiation at the wavelength or is varied as well by modulation of the pump rate of the amplification medium, then the refractive index of the amplification medium is also modulated. This modulation of the refractive index can be employed for modulation of the phase or frequency of the beamed-in signal wave.

FIG. 4 shows an arrangement of the invention wherein the device provided for the in-coupling of the light is composed of a fiber guide fashioned as a fiber amplifier. A semiconductor laser 2 is situated at an output of the fiber amplifier, which amplifier is doped with erbium so that the laser light having the wavelength $\lambda_L$ emitted by the semiconductor laser 2 is shorter by $\lambda = 1500$ nm in the wavelength range than the marked wavelength $\lambda_M$ of the maximum of the gain of the amplification medium of the semiconductor laser 2. The laser light 12 having the wavelength $\lambda_L$ can then be employed for optically pumping the fiber amplifier 20. The signal light 11 having the wavelength $\lambda$ greater than $\lambda_L$ that is amplified by the amplifier 20 passes through the semiconductor laser 2 with either further optical amplification or largely without any amplification, depending on its particular wavelength.

Figure 5:
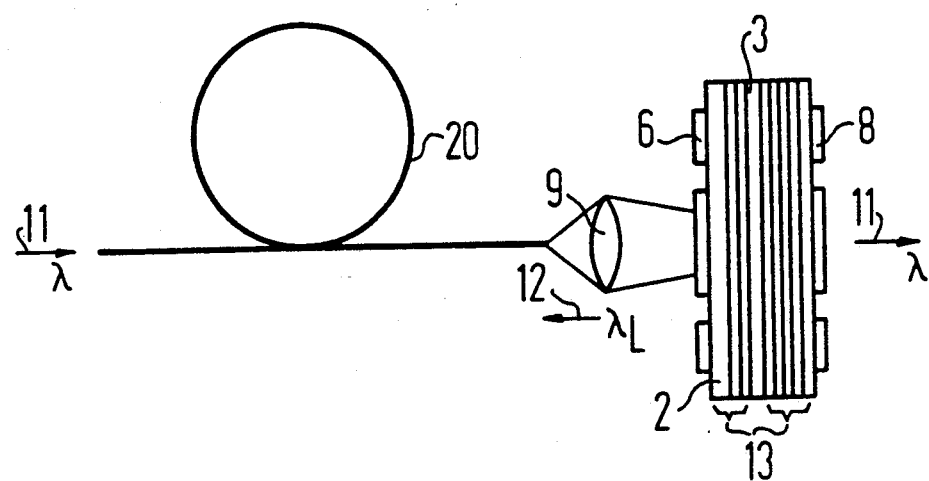
FIG. 5 is a schematic illustration of an alternate arrangement of a fiber amplifier using the arrangement of the present invention.

An embodiment of the inventive arrangement of FIG. 4 is illustrated in FIG. 5, wherein a surface-emitting semiconductor laser is employed. Such a surface-emitting semiconductor laser is characterized in that the laser light of the selected wavelength $\lambda_L$ is coupled out perpendicular to the surface of the substrate 2 on which the active layer of semiconductor laser is grown. In a simple way, the arrangement of FIG. 5 combines the in-coupling of pumped light having the wavelength $\lambda_L$ into the fiber amplifier 20 with the out-coupling of the signal light 11 having the wavelength $\lambda$ from the fiber amplifier. A Bragg reflector 13 having a higher reflection than at the input of the semiconductor laser is situated at the output of the semiconductor laser. The pump light is, therefore, coupled only in the direction of the fiber amplifier. Only the amplified signal 11 emerges at the other end of the semiconductor laser.

Figure 6:
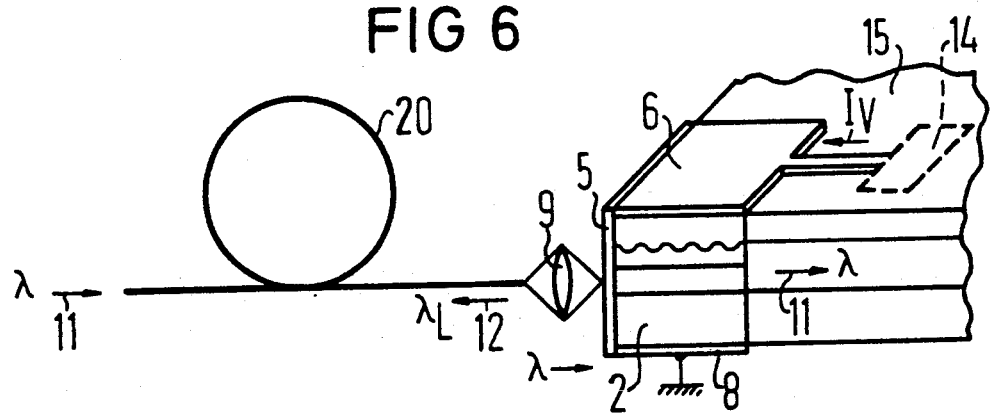
FIG. 6 is an illustration of the arrangement of the present invention as part of an opto-electronic integrated circuit (OEIC)

In the modified form, the arrangement corresponding to FIG. 4 can be utilized for controlling a chip-to-fiber coupling. As illustrated in FIG. 6, a semiconductor laser 2 is utilized that is not a surface-emitting, but is an edge-emitting laser. This laser is part of an opto-electronic integrated circuit (OEIC).

For an optical signal processing on the OEIC 15, the amplified signal 11 having a wavelength λ can be supplied via a planar waveguide and branchers to further components, such as, for example, filters, modulators, photodetectors, and optical logic gates. Given a corresponding arrangement, the coupling losses between optical fiber and the OEIC are compensated in a simple way by optical pre-amplifiers in the fiber amplifier. In particular, an optical receiver with low-noise, optical pre-amplifier can be realized by the optical fiber amplifier followed by the semiconductor laser 2, the filter F and the photodetector. It is not necessary for this arrangement that the wavelengths $\lambda_M$ and $\lambda_L$ are different, so that the difference between the threshold gain of the resonator and the gain of the intensifying medium in the amplifier operation is identical at the selected wavelength $\lambda_L$ and at the marked wavelength $\lambda_M$.

An actively controlled amplification of the light signal can be provided in such an arrangement. The part of the spontaneous emission of the semiconductor laser 2 or a part of the amplified signal light is detected in a control component 14 and a setting current $I_V$ for the semiconductor laser is created therefrom. As a result of this control, the OEIC can work at defined levels of signal light independent of the fluctuations in the infeed degree of the fiber and independent of the fluctuations in the level of the signal light in the fiber. When the Bragg grating in the semiconductor laser is omitted, then a travelling wave amplifier on a semiconductor basis will occur. The control of the level of the signal light can then also be realized with an optical fiber without optical amplification.

Figure 7:
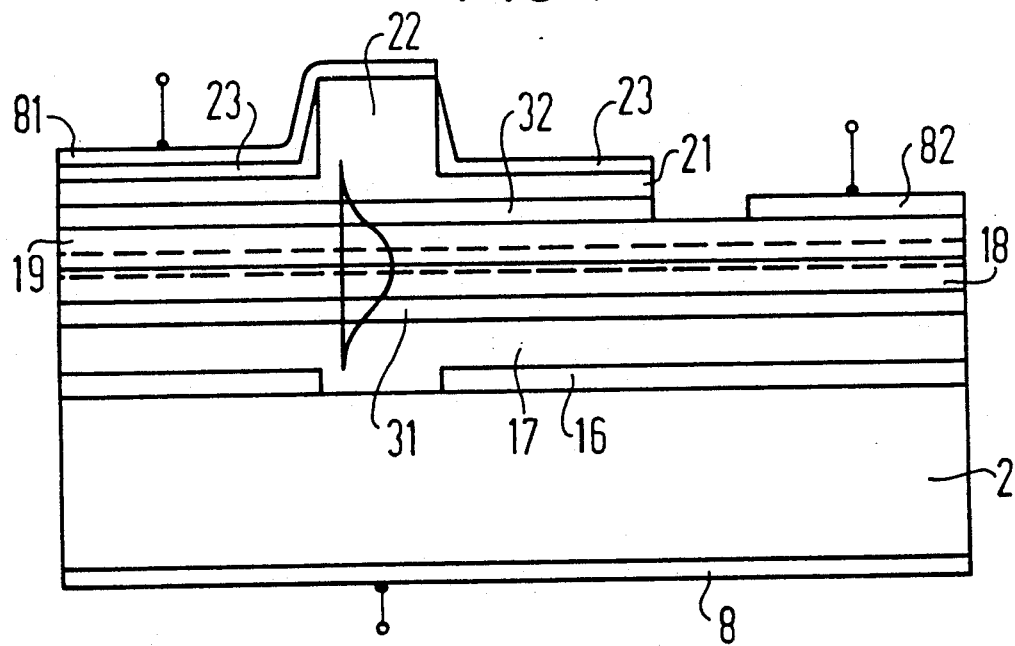
FIG. 7 is a transverse cross sectional view of an alternative embodiment of the present invention.

FIG. 7 shows an especially advantageous, alternative embodiment in cross-section. The saturable absorber is thereby established by the layer 31. Two grating layers 18, 19 for the formation of the Bragg grating are situated over this layer 31. The uppermost or, respectively, lowest courses of the boundary broken lines. The intensifying layer provided for generating the laser emission is arranged on these grating layers 18, 19 as a waveguide layer 32. This waveguide layer 32 is laterally limited. A contact 82 is applied onto the uppermost grating layer 19 to the side of the waveguide layer 32 in that region not covered by the waveguide layer 32. The vertical limitation of the waveguide layer 32 ensues with the cover layer 21 in whose middle a mesa 22 is fashioned. The regions of the surface of the cover layer 21 lying to each side of this mesa 22 are insulated with an oxide layer 23. A contact 81 is applied on the oxide layer. The oxide layer 23 together with this contact 81 serve the purpose of laterally limiting the laser emission to a region that lies essentially under the mesa 22, corresponding to the MCRW principle. The current injected via the substrate contact 8 is limited to the region under the mesa 22 by a barrier layer 16 that is integrated in a buffer layer 17.

The grating layers 18, 19 act both as optical coupling layers as well as electrical conductor layers for the common ground contact for the intensifying medium (waveguide layer 32) and for the absorbent medium (layer 31). In the illustrated arrangement, the coupling layers are n-doped. Both the intensifying medium as well as the absorbent medium can contain quantum wells. A fourth electrode for a phase-shifter current can be forgone in this arrangement. In the present exemplary embodiment, the substrate can, for example, be p$^+$-InP, the barrier layer 16 can be n$^+$-InP, the buffer layer 17 can be p-InP, the layer 31 can be 1.6 μm-InGaAsP, the lower grating layer 18 can be n-1.3 μm-InGaAsP, the upper grating layer 19 can be n$^+$-InP, the waveguide layer 32 can be n-1.5 μm-InGaAsP and the cover layer 21 can be p-InP.

S. Mukai et al, "Coupled parallel waveguide semiconductor laser", *Appl. Phys. Lett.* 44, 1984, pages 478–480 describes a semiconductor laser having two optically coupled intensification layers that can be separately, electrically driven. In contrast to the work of Mukai, the structure of FIG. 7 comprises a Bragg filter and use different materials for the intensifying and for the absorbent layer.

M. C. Amann et al, "Tuning Range and Threshold Current of the Tunable Twin Guide (TTG) laser", *IEEE Photon. Technol. Lett.*, 1989, pages 253–254, describes a semiconductor laser having an intensifier layer and a tuning layer that are optically coupled and can be separately electrically driven. By contrast to the work of Amann, an absorbent layer, for example, is inventively employed instead of the tuning layer, this absorbent layer is capable of being pumped by the laser emission.

Figure 8:
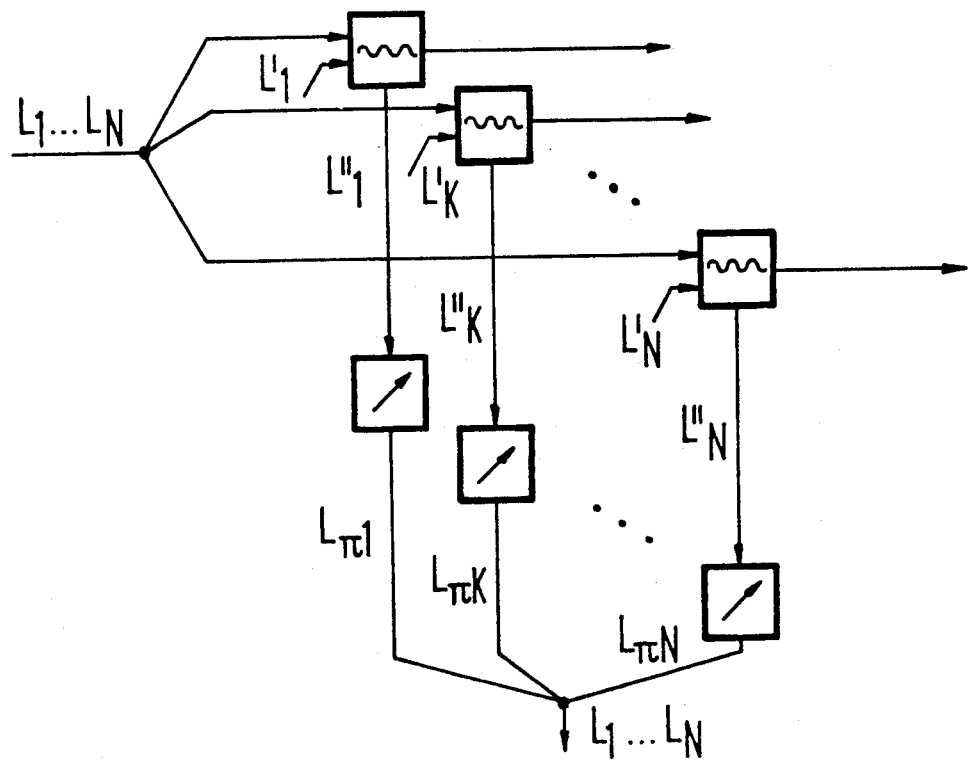
FIG. 8 is a diagram of a wavelength switch using the arrangement of the present invention.

FIG. 8 shows the block circuit diagram of a wavelength switch upon employment of the structures of the invention having N wavelength-selective wavelength converters (referenced with wave lines) and N tunable wavelength converters (referenced with arrows). By contrast to traditional arrangements (see, for example E. J. Bachus et al, "Optical Coherent Multicarrier Switching Equipment", *IOOC'89*, Japan, 1989, paper 20D2-2), the switching of optical channels in the structure of the invention ensues on the basis of multiple optical wavelength conversion, as a result whereof optical filters or electronic intermediate stages can be potentially saved. In the illustrated arrangement, N channels in a wavelength band that contains the wavelength $L_1, \ldots, L_N$ are converted into a second wavelength band that contains the wavelengths $L''_1, \ldots, L''_N$ and are subsequently again converted into a third wavelength band that contains the wavelengths $L'''_1, \ldots, L'''_N$. The first wavelength band and the third wavelength band can also be identical. In this case, for example as entered in FIG. 8, the wavelengths $L''_1, \ldots, L''_N$ of the second wavelength band are transformed back into a permutation of the original wavelengths $L_1, \ldots, L_N$ in the first wavelength band. The wavelength band of the wavelengths $L_1$ through $L_N$ is higher, i.e. these wavelengths are longer than the wavelength band for the wavelengths $L'_1$ through $L'_N$. The information for the pattern of the permutation of the optical channels can, for example, be brought to the wavelength switch by optical signals. In the present example, the wavelength-selective wavelength converters (entered with wave line) are each respectively composed of an electronically tunable local oscillator following by an optical phase shifter, an optical polarization rotator and a wavelength converter of the invention. As wavelength filters, these wavelength converters of the invention have a grating of the second order that effects an emission of the transformed wavelength spatially turned by 90°. As described above, the selection of the wavelength to be transformed occurs by an additional irradiation with an unmodulated radiation having a wavelength that at least approximately corresponds to the wavelength to be selected. The wavelength converter of the invention emits the signal modulated on the selected wavelength on a new wavelength that is defined by the grating integrated in the appertaining wavelength converter. In the drawing, the beamed-in wavelengths are referenced $L_1$ through $L_N$. A non-modulated radiation having the wavelength $L'_1$ that at least approximately corresponds to one of the wavelengths $L_1$ through $L_N$, for example $L_K$, is beamed into the first selective wavelength converter. The remaining wavelengths pass the wavelength converter practically unimpeded (arrow directed toward the right in FIG. 8). A wavelength $L''_1$ that is modulated with the original signal modulated onto $L_K$ is beamed out perpendicular to this beam direction. This wavelength $L''_1$ is transformed in an electronically tunable wavelength converter of the invention, for example into one of the original wavelength $L_1$ through $L_N$. The analogous case occurs with the remaining wavelengths in the pairs of wavelength-selective and tunable wavelength converters respectively provided therefor. In this way, a superimposition of, for example, the original carrier frequencies $L_1$ through $L_N$ is obtained at the output of the arrangement, whereby the respective modulations are now distributed onto these carrier wavelengths in a different permutation. A permutation of the numbers 1 through N is referenced with the indices $\pi 1, \ldots, \pi n$ in FIG. 8.

Although various minor modifications may be suggested by those versed in the art, it should be understood that I wish to embody within the scope of the patent granted hereon all such modifications as reasonably and properly come within the scope of my contribution to the art.

I claim:

1. In an arrangement having a semiconductor laser that includes at least one optical amplification medium with maximum optical gain in laser operations at a mark wavelength $\lambda_M$, a resonator, and means for forming a wavelength filter, said means for forming a wavelength filter selecting a wavelength $\lambda_L$ provided for the laser operation, the improvement comprising the means forming the wavelength filter being constructed so that the difference between the threshold gain of the resonator and the gain of the amplification medium during the laser operation is lower at the selected wavelength $\lambda_L$ than at the marked wavelength $\lambda_M$ and that the arrangement further includes an apparatus for the optical irradiation of the amplifying medium with at least one wavelength.

2. In an arrangement according to claim 1, wherein the means forming the wavelength filter is a grating.

3. In an arrangement according to claim 2, wherein the semiconductor laser comprises a waveguide as an integral component part and that the apparatus for the optical irradiation is an external waveguide coupled tot he waveguide of the semiconductor laser.

4. In an arrangement according to claim 3, wherein the external waveguide is a fiber guide.

5. In an arrangement according to claim 4, wherein the fiber guide is a fiber amplifier doped with erbium and wherein the radiation of the selected wavelength $\lambda_L$ emitted by the semiconductor laser is used for the optical pumping of the fiber amplifier.

6. In an arrangement according to claim 1, wherein end faces of the existing resonator of the semiconductor laser are provided with anti-reflection coatings.

7. In an arrangement according to claim which includes an apparatus for outfeed of the radiation from the semiconductor laser.

8. In an arrangement according to claim 1, wherein the semiconductor laser contains an optically saturatable absorber.

9. In an arrangement according to claim 1, wherein the selected wavelength $\lambda_L$ differs from the marked wavelength $\lambda_M$ by at least so much that the means forming the wavelength filter is transmissive for the marked wavelength $\lambda_M$.

10. In an arrangement according to claim 1, wherein the apparatus for the optical irradiation beams in a wavelength $\lambda$, which is outside of the wavelength range around the selected wavelength $\lambda_L$, at which the means for forming a wavelength filter is essentially reflective.

11. In an arrangement according to claim 1, wherein the arrangement operates as an optical feedback amplifier and wherein the strength of an applied operating current $I_V$ is set so that the semiconductor laser will emit at the selected wavelength $\lambda_L$ and wherein the beamed-in light has a wavelength at which the means forming the wavelength filter is transmissive.

12. In an arrangement according to claim 11, wherein the wavelength of the beamed-in light approximately corresponds to the marked wavelength $\lambda_M$.

13. In an arrangement according to claim 1, wherein the arrangement is a tunable optical wavelength converter and the selected wavelength $\lambda_L$ is utilized as an output signal.

14. In an arrangement according to claim 1, which is operated as an optical logic gate, wherein the beamed-in optical intensity is increased so that the laser emission of the selective wavelength $\lambda_L$ is entirely quenched.

15. In an arrangement according to claim 1, wherein the arrangement operates as an optical pulse regenerator.

16. In an arrangement according to claim 1, wherein the semiconductor laser contains an optically saturatable absorber and wherein said arrangement is an optically controllable pulse generator.

17. In an arrangement according to claim 1, which includes means forming a phase modulator by varying the refractive index of the amplification medium, said means for varying the refractive index includes means for applying a variation in the electrical pump rate with respect to the optical irradiation so that the arrangement is a phase modulator.

18. In an arrangement according to claim 1, wherein the semiconductor laser comprises a waveguide having an integral component part, and said apparatus for applying the optical irradiation is an external waveguide coupled to said waveguide of the semiconductor laser.

19. An arrangement having at least one pair of wavelength converters whereof at least one wavelength converter is an arrangement of claim 1 for operating a wavelength switch, whereby a wavelength is selected in the respectively first arrangement of such a pair from a superimposition of a plurality of wavelengths belonging to a first wavelength band with signals modulated thereon, the signal modulated thereon is modulated on a new wavelength from a second wavelength band that is disjunctive with the first, and this new wavelength is transformed in the second arrangement of this pair into a wavelength of a third wavelength band.

20. An arrangement having a pair of wavelength converters whereof at least one wavelength converter is an arrangement according to claim 1, for operation as a wavelength switch, whereby a wavelength belonging to a wavelength band is transformed into a wavelength outside of this wavelength band in the first arrangement of this pair and is subsequently transformed in the second arrangement of this pair into a wavelength within the wavelength band.

* * * * *